United States Patent
Watabe

[19]

[11] Patent Number: 5,811,349
[45] Date of Patent: Sep. 22, 1998

[54] METHOD FOR GROWING A SEMICONDUCTOR LAYER

[75] Inventor: Masahiro Watabe, Kawasaki, Japan

[73] Assignee: Fujitsu Limited, Kawasaki, Japan

[21] Appl. No.: 743,530

[22] Filed: Nov. 4, 1996

Related U.S. Application Data

[62] Division of Ser. No. 355,647, Dec. 14, 1994, Pat. No. 5,601,651, which is a division of Ser. No. 121,508, Sep. 16, 1993, abandoned.

[30] Foreign Application Priority Data

Sep. 17, 1992 [JP] Japan ................................. 4-246978
Jul. 30, 1993 [JP] Japan ................................. 5-190604

[51] Int. Cl.⁶ .................................................. H01L 21/20
[52] U.S. Cl. ........................ 438/478; 438/503; 438/507
[58] Field of Search .................................. 438/503, 478, 438/507; 118/715; 137/625.4; 251/209

[56] References Cited

U.S. PATENT DOCUMENTS

| | | |
|---|---|---|
| Re. 25,920 | 11/1965 | Moen . |
| 1,319,755 | 10/1919 | Cherry . |
| 2,854,027 | 9/1958 | Kaiser . |
| 2,861,769 | 11/1958 | Schumann ................................. 251/86 |
| 2,934,311 | 4/1960 | Sjöholm ................................. 251/209 |
| 3,354,904 | 11/1967 | Federle et al. ........................ 251/209 |
| 3,698,683 | 10/1972 | De Angelis ............................. 251/209 |
| 3,717,177 | 2/1973 | Glesmann . |
| 4,131,128 | 12/1978 | Gotzenberger . |
| 4,146,055 | 3/1979 | Ryder . |
| 4,475,573 | 10/1984 | Hindman . |
| 4,667,927 | 5/1987 | Oscarsson .............................. 251/209 |
| 4,747,367 | 5/1988 | Posa ........................................ 118/715 |
| 4,761,269 | 8/1988 | Conger et al. ......................... 422/245 |
| 4,802,506 | 2/1989 | Aslanian . |
| 5,186,120 | 2/1993 | Ohnishi . |
| 5,370,154 | 12/1994 | Greer . |

FOREIGN PATENT DOCUMENTS

| | | |
|---|---|---|
| 965 694 | 12/1957 | Germany . |
| 4-102908 | 4/1992 | Japan . |
| 7700744 | 7/1978 | Netherlands . |
| 88971 | 4/1937 | Sweden . |
| 21477 | 8/1912 | United Kingdom . |

*Primary Examiner*—Tuan H. Nguyen
*Attorney, Agent, or Firm*—Staas & Halsey

[57] ABSTRACT

A fluid switching valve comprises a valve box and a rotary valve element. The valve box is provided with a plurality of fluid inlets and a single fluid outlet connected with each other by a fluid passage, wherein the rotary valve element is formed to block the fluid passage for an arbitrary rotational angle of the valve element, by engaging with an inner wall of the fluid passage. The valve element carries on an outer surface thereof a plurality of grooves in correspondence to the plurality of fluid inlets, wherein each of the grooves has a cross sectional area that changes from a first end to a second end, such that a sum of the cross sectional areas of the plurality of grooves is maintained substantially constant.

2 Claims, 14 Drawing Sheets

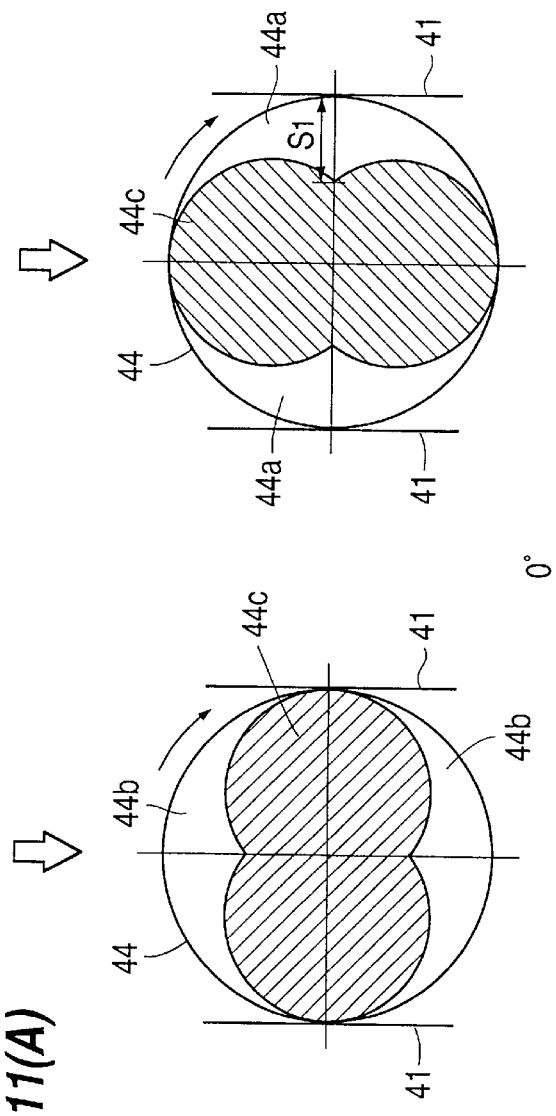
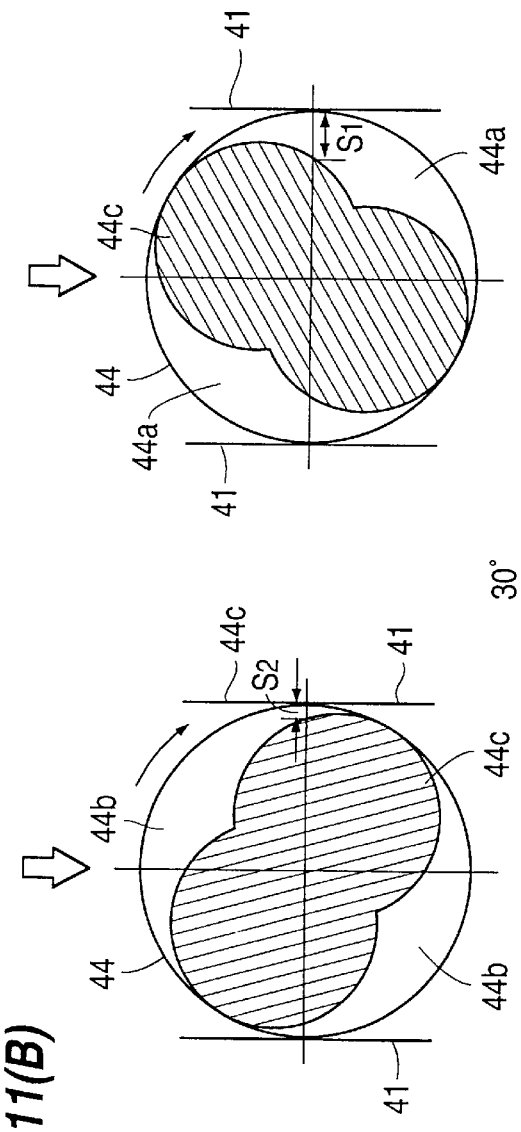
FIG. 11(A)
FIG. 11(B)

METHOD FOR GROWING A SEMICONDUCTOR LAYER

This application is a division of application Ser. No. 08/355,647, filed Dec. 14, 1994, now U.S. Pat. No. 5,601,651 which is a division of application Ser. No. 08/121,508, filed Sept. 16, 1993, now abandoned.

BACKGROUND OF THE INVENTION

The present invention generally relates to fabrication of semiconductor devices and more particularly to a flow control valve for use in deposition systems used for fabricating a semiconductor device, for controlling supply of gaseous source materials.

In the fabrication of semiconductor devices, various vapor phase deposition processes are employed for depositing a semiconductor layer on a substrate. In such vapor phase deposition processes, a gaseous source material of a desired semiconductor layer is introduced into a reaction chamber, and the deposition of the semiconductor layer is achieved by causing a decomposition of the gaseous source material in the vicinity of the surface of the substrate. As a result of the decomposition, atoms forming the semiconductor layer are released, and the atoms thus released occupy the crystallographic sites of the semiconductor layer that is to be deposited on the substrate. Thereby, the semiconductor layer is grown on the substrate while maintaining an epitaxy with respect to the substrate.

Meanwhile, intensive studies are being made recently on the so-called compound semiconductor devices that employ a compound semiconductor material such as GaAs. These compound semiconductor materials generally have an increased carrier mobility as compared to conventional, single component semiconductor materials such as Si or Ge, and are characterized by the band structure that allows direct transition of carriers. Generally, compound semiconductor materials form a multi-component mixed crystal over a wide compositional range, and techniques are studied to grow semiconductor layers with a composition tailored in correspondence to the specific application of the semiconductor device. For example, formation of a superlattice structure that includes an alternate deposition of GaAs and AlGaAs, is commonly employed in the fabrication of optical semiconductor devices such as laser diodes as well as in the fabrication of quantum semiconductor devices that employs the tunneling effect of carriers. The deposition of such compound semiconductor materials is generally achieved by the metal-organic chemical vapor deposition (MOCVD) process that employs metal-organic source materials.

When forming such a compound semiconductor material, it is necessary to change the composition of the gaseous source material in correspondence to the deposition of each semiconductor layer. Thus, a MOCVD apparatus is required to have a capability of switching the gaseous source material at a high speed and with reliability. Particularly, in the atomic layer epitaxy (ALE) process wherein the semiconductor layer is grown one atomic layer by one atomic layer while changing the composition of the gaseous source material in each atomic layer, it is necessary to switch the composition of the gaseous source material at a very high speed. In the ordinary growth process of compound semiconductor layers, too, incomplete switching of the gaseous source material may lead to the formation of an undesirable boundary layer between one semiconductor layer and another semiconductor layer. Such a boundary layer has a deviated composition and can cause a detrimental effect on the high speed semiconductor devices such as HEMT that utilizes the property of the heterojunction interface. In view point of increasing the throughput of fabrication, the switching of the gaseous source materials has to be achieved as fast as possible.

FIG. 1 shows a typical conventional MOCVD apparatus.

Referring to FIG. 1, the MOCVD apparatus includes a reaction chamber 1 in which a semiconductor substrate 1a is disposed for deposition of a desired semiconductor layer such as GaAs or AlGaAs. The reaction chamber 1 is supplied with gaseous source materials via a supply line $1_1$, and the gaseous source materials thus supplied release the atoms that form the semiconductor layer, upon decomposition of the gaseous source materials on the surface of the substrate 1a. Upon decomposition, the gaseous source materials are evacuated from the reaction chamber 1 via an evacuation line $1_2$ and are released to the environment after processing at a scrubber 3.

In the illustrated example, the MOCVD apparatus includes bubblers 4a–4c for supplying the gaseous source materials, wherein the bubblers 4a–4c hold metal-organic sources such as TMG, TMA, and the like. Each of the bubblers 4a–4c is supplied with a hydrogen carrier gas via a corresponding mass flow controller (MFC), and there occurs a bubbling of the metal-organic sources in the bubblers. As a result of the bubbling, gaseous source materials that may contain Ga or Al are formed, and the gaseous source materials thus formed are supplied, together with the carrier gas, to the foregoing supply line $1_1$ via a gas switching mechanism 2. Similarly, gas cylinders 4d and 4e containing therein a high pressure gas of arsine (AsH$_3$) or disilane (Si$_2$H$_6$) are connected to the line $1_1$ via the gas switching mechanism 2. Thereby, the bubblers 4a–4c and the cylinders 4d and 4e form a gaseous source supplying unit.

It should be noted that the bubblers 4a–4c or the cylinders 4d and 4f supply the gaseous source materials constantly and continuously. Thus, the foregoing gaseous source supplying unit has to be able to switch the flow of the gaseous source materials such that one or more gaseous source materials are supplied directly to the scrubber 3 while circumventing the reaction chamber 1 when the gaseous source materials are not used in the reaction chamber 1 for the deposition of the semiconductor layer. For this purpose, the gas switching mechanism 2 is connected with a purge line $1_3$ such that those source materials that are supplied from the gaseous source supplying unit 4a–4e but not used in the reaction chamber 1 are bypassed to the scrubber 1 via the lines $1_3$ and $1_2$.

The gas switching mechanism 2 includes switching valves 2a–2h, wherein the switching valve 2a has an outlet connected to the foregoing line $1_1$, and further to the inlet of the switching valve 2e. Thereby, the switching valve 2a is supplied with a mixture of the gaseous source materials formed at the bubblers 4a and 4b and supplies the mixture selectively either to the line $1_1$ or to the inlet of the valve 2e. The valve 2e has an outlet connected to the foregoing purge line $1_3$. Similarly, the switching valve 2b is supplied with the gaseous source material formed at the bubbler 4c and supplies the same either to the line $1_1$ or to an inlet of the switching valve 2f. Further, the switching valve 2c is supplied with the gaseous source material in the gas cylinder 4d and supplies the same either to the supply line $1_1$ or to the inlet of the switching valve 2g, while the switching valve 2d is supplied with the gaseous source material in the gas cylinder 4e and supplies the same either to the supply line $1_1$ or to the inlet of the switching valve 2h. It should be noted that each of the valves 2e–2h has the outlet connected to the foregoing purge line l₃.

In such a construction, the valves 2a–2d form a part of the supply system while the valves 2e–2f form a part of the purge system. Thus, when a valve of the supply system such as the valve 2a is activated, the gaseous source materials formed at the bubblers 4a and 4b are supplied to the reaction chamber 1 via the supply line l₁. When the valve 2a is deactivated, on the other hand, the gaseous source materials are supplied directly to the scrubber 3 via the purge line l₃, without passing through the reaction chamber 1.

On the other hand, each of the valves 2e–2h of the purge system is supplied either with the hydrogen carrier gas or with a nitrogen purge gas, and supplies the same to the inlet of the corresponding valve of the supply system. For example, the valve 2e supplies the purge gas to the inlet of the valve 2a, while the valve 2f supplies the purge gas to the inlet of the corresponding valve 2b. Thus, when a valve of the purge system such as the valve 2e is activated, the purge gas flows through the valve 2a and the line l₁ to the reaction chamber 1 and causes a flushing therein.

In the MOCVD apparatus of the foregoing construction, it is desired to minimize the variation in the flow rate as well as the pressure of the gaseous source materials that flow through the supply line l₁, even when the state of the valves 2a–2d is switched between the opened state and the closed state. As described previously, such a variation in the supply pressure of the gaseous source material in the reaction chamber 1 may invite a deviation in the composition or other quality of the semiconductor layer that is deposited on the substrate 1a. Thus, the valves 2a–2h forming the gas switching mechanism 2 of FIG. 1 are required to have the capability of controlling the flow rate-accurately when switching the gaseous source materials.

Meanwhile, the switching valves 2a–2h of the MOCVD apparatus of FIG. 1 are required, in addition to the capability of controlling the flow rate accurately, to have the capability of switching the gaseous source materials at a very high speed. FIG. 2 shows an example of such a switching of the gaseous source materials that is employed for conducting an atomic layer epitaxy process. As indicated in FIG. 2, the atomic layer epitaxy is achieved by supplying metal-organic source materials such as TMA or TMG like an impulse with an intervening flushing by hydrogen, wherein each pulse duration is preferably set below 1 second.

Conventional MOCVD apparatuses generally use a butterfly valve 5 having a construction of FIG. 3(A) for controlling or switching the flow rate of the gaseous source materials. A butterfly valve 5 has a valve box in which a valve chest 5c is provided to extend from an inlet 5a to an outlet 5b. The valve chest 5c is provided with a plate 6 acting as a valve element such that the plate 6 rotates about a rotational axis. Thus, the butterfly valves have a simple construction and can be manufactured with little cost. On the other hand, as shown in FIG. 3(B), the butterfly valves have a drawback in that the relationship between the flowrate and the valve position is generally not linear except for very small valve positions in the range of about 20–30%. When the valve position exceeds the foregoing range, the flow control by the butterfly valve is no longer effective. Thus, use of the butterfly valves in the MOCVD apparatus of FIG. 1 raises various problems.

FIG. 4(A) shows another example of the switching valve used in the MOCVD apparatus, wherein the valve includes a compartment plate 7 disposed to interrupt the flow of the gaseous source material, and a passage 7a of the gaseous source is provided on the compartment plate 7. Further, a flexible diaphragm 8 is provided to close the foregoing passage 7a such that the diaphragm 8 is actuated by an air pressure. Thereby, the switching valve of FIG. 4(A) can provide a very high response.

On the other hand, the valve of FIG. 4(A) has a drawback in that it cannot control the flow rate as a function of the valve position. Further, as indicated in FIG. 4(B), the valve tends to show a delay in operation in that it takes some time from the activation of the valve by the air pressure until the gaseous source material actually starts to flow through the passage 7a. In addition, such an activation of the valve tends to cause an overshoot in the flowrate. Thereby, there is a tendency that an interface layer having a deviated composition is formed at a boundary between one semiconductor layer and another semiconductor layer deposited thereon.

SUMMARY OF THE INVENTION

Accordingly, it is a general object of the present invention to provide a novel and useful flow control valve and a deposition apparatus of semiconductor layers that employs such a flow control valve wherein the foregoing problems are eliminated.

Another and more specific object of the present invention is to provide a flow control valve, comprising: a valve box having an inlet for introducing a fluid, an outlet for discharging said fluid, and a passage of fluid defined by an inner wall and provided in said valve box so as to communicate between said inlet and said outlet for passing said fluid from said inlet to said outlet; and a valve element provided in said passage of said valve box so as to be rotatable about a rotational axis, said valve element having an outer surface in conformity to said inner wall of said passage for inhibiting said fluid to pass from said inlet to said outlet through said passage;

said outer surface of said valve element being formed to inhibit a passage of said fluid from said inlet to said outlet for an arbitrary rotational angle of said valve element about said rotational axis;

said valve element carrying a groove on said outer surface thereof so as to extend for a predetermined arc length when viewed in a direction of said rotational axis;

said groove having a width and a depth, wherein at least one of said width and said depth is changed from a first end of said groove to a second, opposite end of said groove.

According to the present invention, it is possible to control the flowrate of the fluid passing through the flow control valve substantially linearly for an entire range of the valve position between 0% and 100%, by providing the groove to extend from an arc length of 180 degrees. It should be noted that the conductance C of a valve is proportional to the cross sectional area S of the valve and is represented as

C S or

C=cS where c is a constant.

In the flow control valve of the present invention, the cross sectional area S is changed from the first end to the second end of the groove linearly as set forth above. Thereby, the conductance C of the valve is changed as a function of the valve position θ, and one can control the flow rate F of the fluid according to the relationship $$F = C(\theta) \cdot \Delta P,$$

wherein $\Delta P$ represents the pressure drop between the inlet and outlet of the valve. Thus, by forming the valve element to have a shape such that the fluid is blocked completely by the valve element irrespective of the valve position of the valve element and by forming the foregoing groove to extend for a predetermined arc length such as 180 degrees when viewed in the direction of the rotational axis of the valve element, it is possible to control the flow rate of the fluid substantially linearly for substantially the entire range of valve position form 0% to 100%.

Another object of the present invention is to provide a fluid switching valve comprising: a valve box having a plurality of inlets for introducing a plurality of fluids, a single outlet for discharging a fluid, and a single passage of fluid defined by an inner wall and provided in said valve box so as to communicate between said plurality of inlets and said single outlet; a valve element provided in said passage of said valve box so as to be rotatable about a rotational axis, said valve element having an outer surface in conformity to said inner wall of said passage of fluid for inhibiting said fluid to pass from said inlet to said outlet through said passage; and a compartment wall means provided in engagement with said valve element for inhibiting a fluid introduced into any one of said plurality of inlets to flow to the other inlets;

said outer surface of said valve element being formed to inhibit a passage of said fluid from said inlet to said outlet for an arbitrary rotational angle of said valve element about said rotational axis;

said valve element carrying, on said outer surface thereof, a plurality of grooves provided in correspondence to said plurality of inlets such that each of said grooves extend along said outer surface of said valve element for a predetermined arc length when viewed in a direction of said rotational axis, each of said plurality of grooves guiding a fluid introduced to a corresponding inlet to said single outlet;

each of said plurality of grooves having a depth and a width such that at least one of said depth and said width changes from a first end of said groove to a second, opposite end of said groove;

each of said plurality of grooves being formed with mutually different angular positions when viewed in said direction of said rotational axis;

each of said plurality of grooves being formed to have a shape such that said fluid switching valve provides a substantially constant conductance of fluid.

According to the present invention, it is possible to switch the fluid from a first fluid to a second fluid while maintaining a substantially constant valve conductance, by optimizing the shape of the grooves formed on the valve element. In the fluid switching valve of the present invention, the first groove and the second groove are formed to satisfy a relationship $$S_1(\theta)+S_2(\theta)=\text{constant},$$

where $S_1$ represents the cross sectional area of the first groove while $S_2$ represents the cross sectional area of the second groove. Thereby, the flow rate of the fluid discharged from the fluid switching valve is maintained irrespective of the state of the valve element.

Another object of the present invention is to provide a vapor phase deposition apparatus for depositing a semiconductor layer on a substrate from a vapor phase material, comprising: a plurality of containers for storing and supplying gaseous source materials of said semiconductor layer; a reaction chamber for supporting said substrate; a piping system connected to said plurality of containers and to said reaction chamber for supplying said gaseous source materials from said plurality of containers to said reaction chamber; a fluid switching valve provided on said piping system for selectively supplying said plurality of gaseous source materials to said reaction chamber, said fluid switching valve comprising:

a valve box having a plurality of inlets for introducing a plurality of fluids, a single outlet for discharging a fluid, and a single passage of fluid defined by an inner wall and provided in said valve box so as to communicate between said plurality of inlets and said single outlet;

a valve element provided in said passage of said valve box so as to be rotatable about a rotational axis, said valve element having an outer surface in conformity to said inner wall of said passage of fluid for inhibiting said fluid to pass from said inlet to said outlet through said passage; and a compartment wall means provided in engagement with said valve element for inhibiting a fluid introduced into any one of said plurality of inlets to flow to the other inlets;

said outer surface of said valve element being formed to inhibit a passage of said fluid from said inlet to said outlet for an arbitrary rotational angle of said valve element about said rotational axis;

said valve element carrying, on said outer surface thereof, a plurality of grooves provided in correspondence to said plurality of inlets such that each of said grooves extend along said outer surface of said valve element for a predetermined arc length when viewed in a direction of said rotational axis, each of said plurality of grooves guiding a fluid introduced to a corresponding inlet to said single outlet;

each of said plurality of grooves having a cross sectional area that changes from a first end of said groove to a second, opposite end of said groove;

each of said plurality of grooves being formed with mutually different angular positions when viewed in said direction of said rotational axis;

each of said plurality of grooves being formed to have a shape such that said fluid switching valve provides a substantially constant conductance of fluid.

According to the present invention, it is possible to maintain the conductance of the valve substantially constant during the transient step for switching the gaseous source material that is supplied to the reaction chamber. Thereby, the problem of unwanted formation of a boundary layer having a deviated composition at the interface between a semiconductor layer and another semiconductor layer, is effectively eliminated.

Another object of the present invention is to provide a process for growing a semiconductor layer on a substrate held in a reaction vessel, by supplying a gaseous source material selected from a plurality of gaseous source materials into said reaction vessel, comprising a step of:

switching said plurality of gaseous source materials by activating a fluid switching valve to select said gaseous source material that is supplied to said reaction chamber;

said step of switching being conducted while maintaining a conductance of said fluid switching valve substantially constant.

Other objects and further features of the present invention will become apparent from the following detailed description when read in conjunction with the attached drawings.

BRIEF DESCRIPTION OF THE DRAWINGS

FIGS. 11(A)–11(D) are diagrams showing the operation of the fluid switching valve of the fourth embodiment;

DETAILED DESCRIPTION OF PREFERRED EMBODIMENTS

Figure 5:
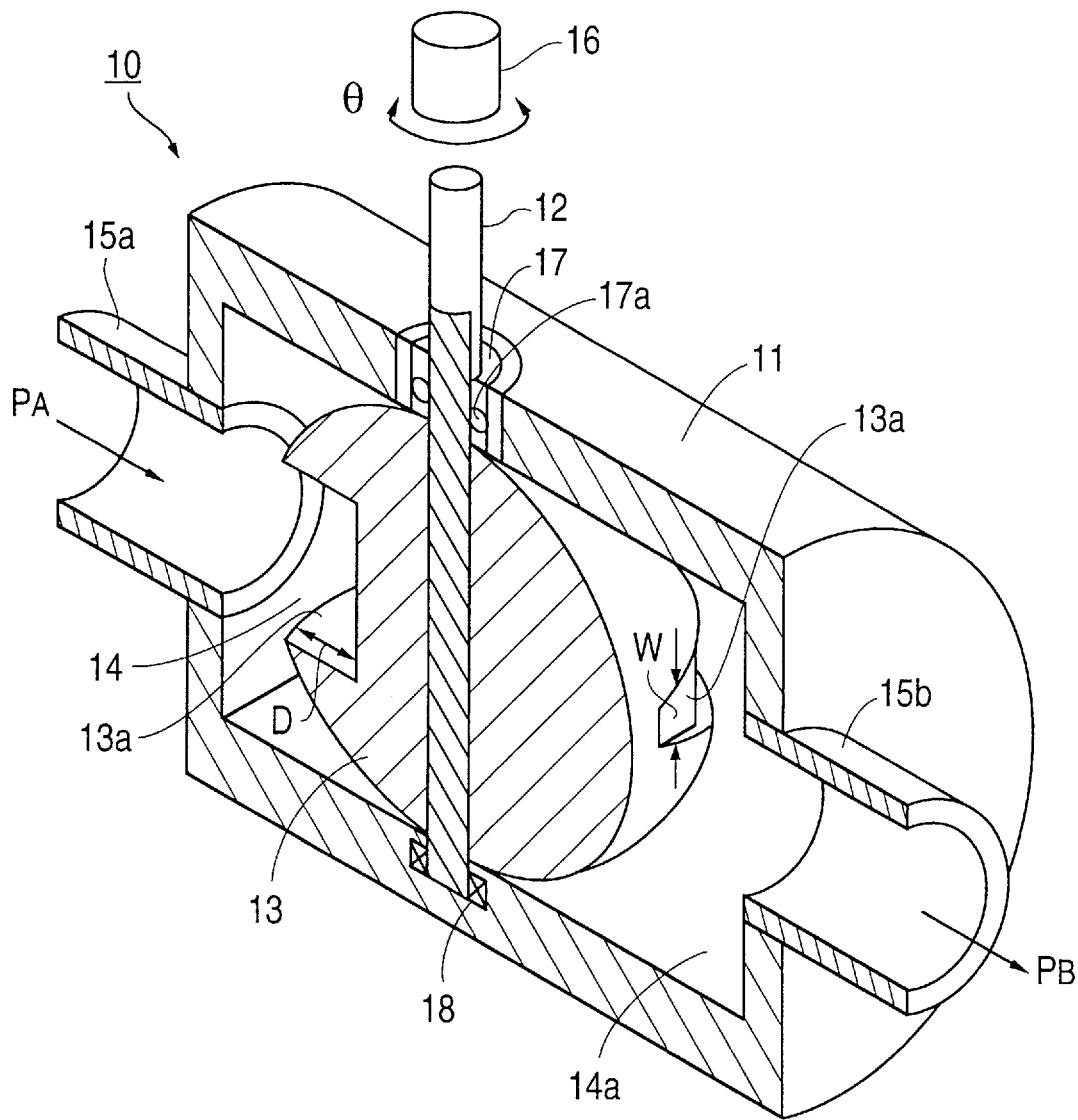
FIG. 5 is a diagram showing the construction of a flow control valve according to a first embodiment of the present invention.

FIG. 5 shows a flow control valve 10 according to a first embodiment of the present invention in a cross sectional view.

Referring to FIG. 5, the flow control valve has a generally cylindrical valve box 11 that is provided with an inlet 15$a$ and an outlet 15$b$ for a fluid. The valve box 11 is provided therein with a cylindrical passage 14 of fluid such that the passage 14$a$ communicates with the inlet 15$a$ and the outlet 15$b$. The passage 14$a$ is provided with a spherical valve element 13 so as to be rotatable about a shaft 12 that extends in a diametrical relationship with respect to the cylindrical passage 14$a$. In FIG. 5, the rotational angle of the valve body 13 about the rotational axis 12 is represented as $\theta$. As described above, the shaft 12 is provided transverse to the passage 14 such that an end of the shaft 14 is held rotatable on the valve box 11 by a bearing 18. Further, the part of the shaft 12 that diametrically opposes the foregoing end of the shaft 12 across the passage 14, is also held rotatable on the valve box 11 by a bearing 17 that includes therein a seal ring 17$a$. The shaft 12 is driven by a motor 16.

The spherical valve element 13 is held on the shaft to rotate therewith as a unitary body, wherein the valve element 13 has a radius corresponding to the radius of the cylindrical fluid passage 14. As a result, the inner wall of the fluid passage 14 engages continuously with the outer surface of the spherical valve element 13 irrespective of the rotational angle $\theta$ of the element 13. Thereby, the fluid introduced into the inlet 15$a$ is blocked by the valve element 13 and does not flow to the outlet 15$b$. In other words, spherical surface of the valve element 13 forms a hermetic seal with respect to the cylindrical inner wall of the fluid passage 14.

On the spherical surface of the valve element 13, it should be noted that there is formed a groove 13$a$ to extend for an arc length slightly smaller than 180 degrees when viewed in the direction of the rotational axis 12. Thus, when the rotational angle $\theta$ of the valve element 13 is set to zero degree, the valve element 13 blocks the fluid completely, while when the element 13 is rotated in the positive direction of the angle $\theta$, the fluid starts to flow through the valve. Thereby, in order to control the flowrate of the fluid flowing through the valve as a function of the rotational angle $\theta$ of the valve element 13, the groove 13$a$ on the valve element 13 is formed to have a cross section such that the cross section increases gradually from one end of the groove 13$a$ to the other, opposite end of the groove 13$a$. In the illustrated example, the groove 13$a$ has a width W and a depth D that change generally from the first end to the opposite end.

It should be noted that the arc length of the groove 13$a$, when viewed from the direction of the rotational axis 12, may be set smaller or larger than 180 degrees. When the arc length of the groove 13$a$ is set larger than 180 degrees, the fluid flows through the valve for the entire valve position of the valve element 13. In other words, the flow control valve having such a construction allows the passage of the fluid all the time. On the other hand, when the arc length of the groove 13$a$ is set smaller than 180 degrees, the valve allows the fluid to flow only when the rotational angle of the valve element 13 exceeds a predetermined threshold angle.

Figure 6A:
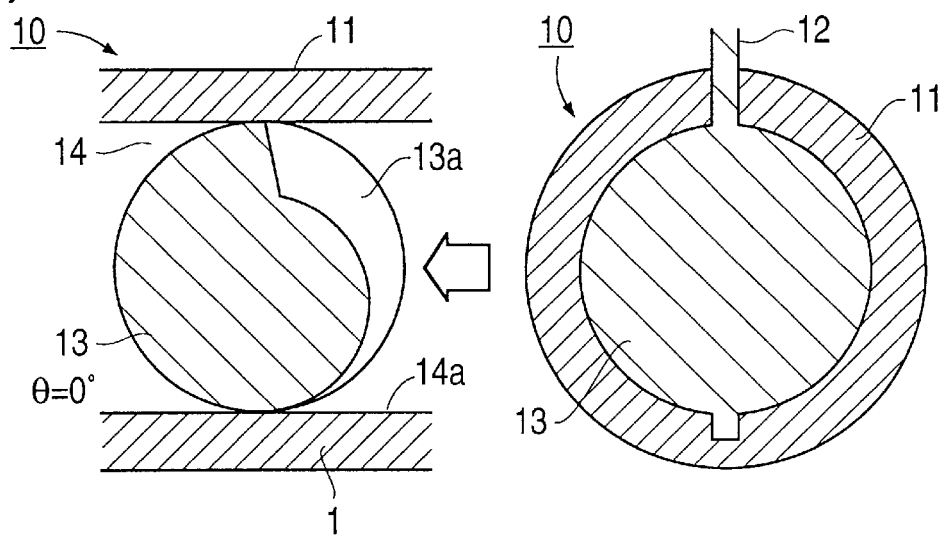
FIGS. 6(A)–6(C) are diagrams showing the relationship between the valve position and the cross section of the fluid passage in the flow control valve of FIG. 5.
Figure 6B:
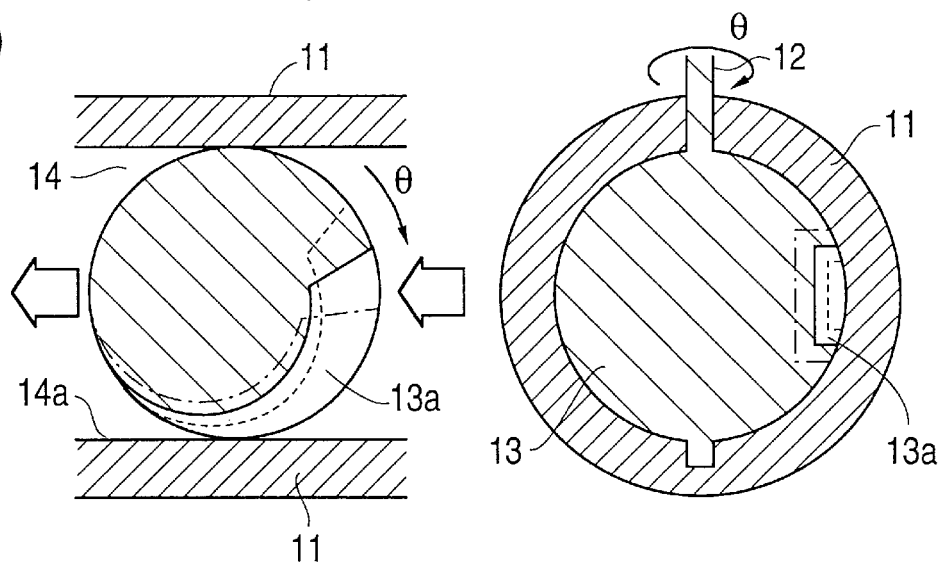
Figure 6C:
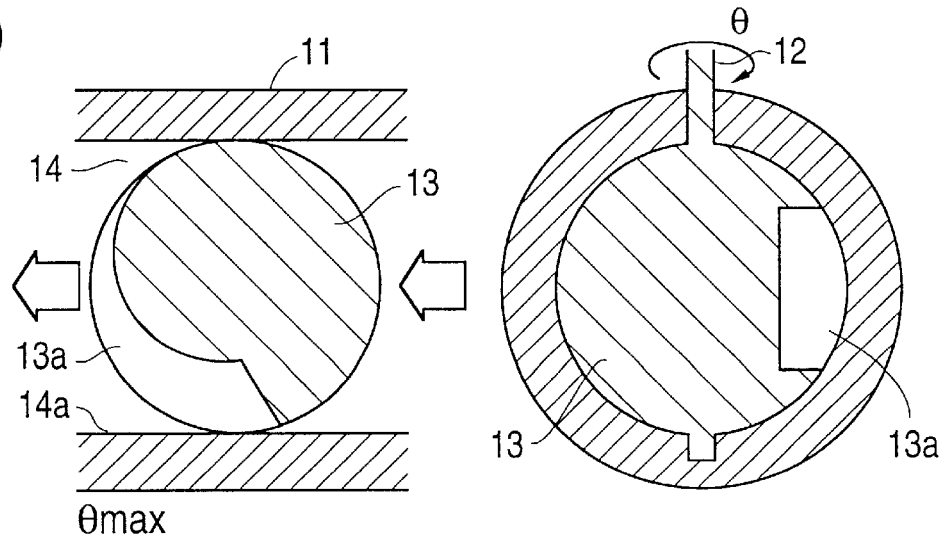

FIGS. 6(A)–6(C) show the operation of the valve 10 in three different states, wherein in each of FIGS. 6(A)–6(C), the drawing at the left shows the cross sectional view of the valve 10 seen from the direction of the rotational axis 12, while the drawing at the right shows the cross sectional view of the same valve 10 as viewed from the direction of the outlet 15$b$. Any of these cross sectional diagrams show a cross section that includes the center of the spherical valve element 13.

Referring to FIG. 6(A), it will be noted that the rotational angle $\theta$ of the valve element 13 is set to zero, and the valve element 13 blocks the fluid passage 14 completely. In this state, the fluid introduced to the inlet 15$a$ is completely blocked by the valve element 13. In other words, FIG. 6(A) shows the valve 13 in the state wherein the valve position is 0%.

When the valve element 13 is rotated in the clockwise direction by an angle $\theta$ from the state of FIG. 6(A) to the state of FIG. 6(B), the passage of the fluid is opened in correspondence to the groove 13$a$ as indicated in the cross sectional diagram at the right, and the fluid introduced into the inlet 15$a$ starts to flow to the outlet 15$b$ through the groove 13$a$ as indicated by an arrow. With further increase in the rotational angle $\theta$ of the valve element 13, the cross sectional area of the fluid passage, formed by the groove 13$a$, increases gradually, and the flowrate of the fluid that flows through the valve 10 increases accordingly.

FIG. 6(C) shows the state wherein the cross sectional area of the fluid passage, provided by the groove 13$a$, is set to maximum. The rotational angle $\theta$ of the valve element 13 corresponding to this state is represented as $\theta_{max}$. When the angle θ exceeds the foregoing maximum angle $θ_{max}$, the flowrate of the fluid flowing through the valve decreases rapidly. When the angle θ reaches 180 degrees, the passage of the fluid is again blocked completely. In correspondence to the angle $θ_{max}$ of the valve element 13, the valve position of the valve 10 becomes 100%.

Figure 1:
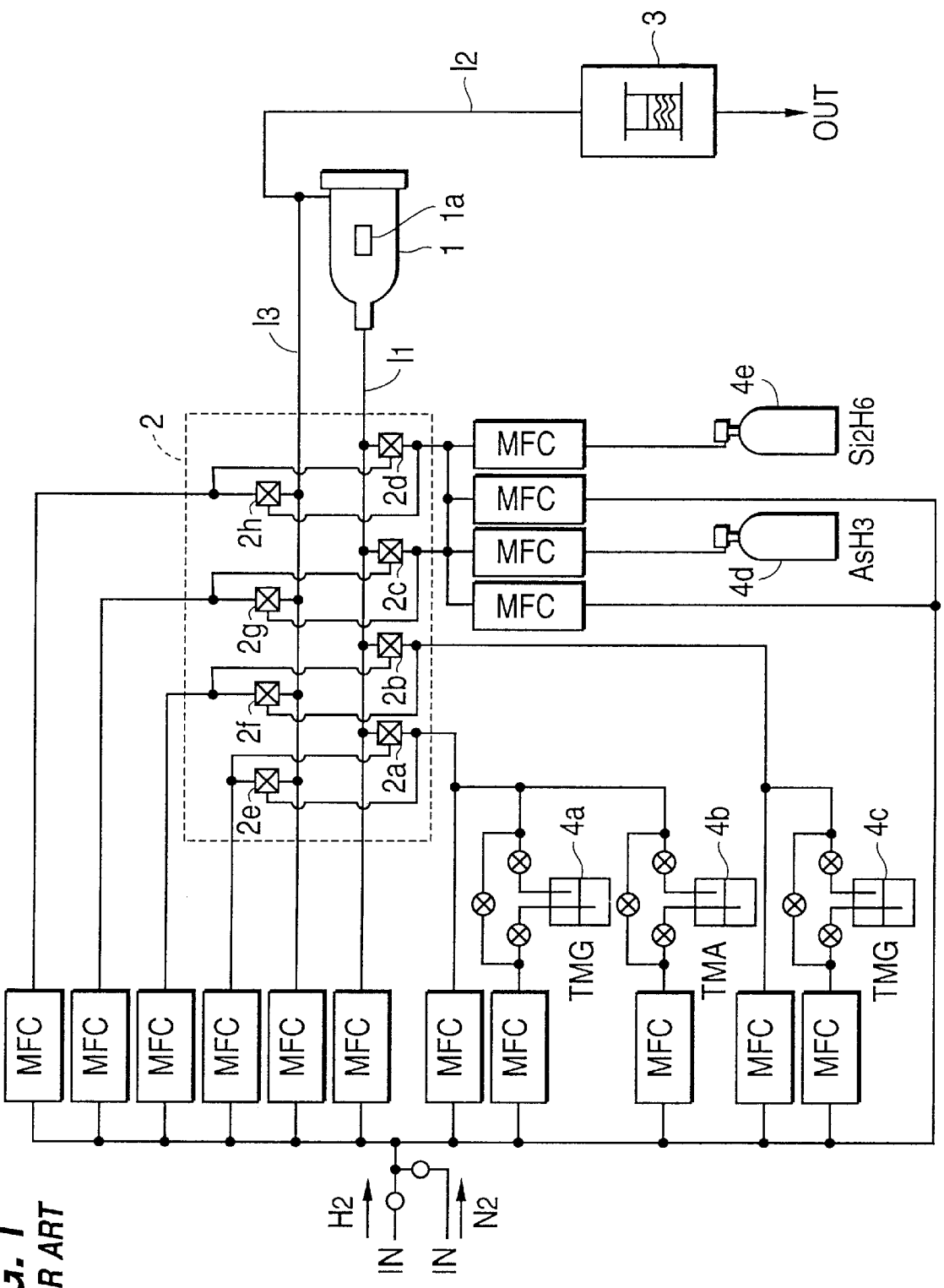
FIG. 1 is a diagram showing the construction of a conventional MOCVD apparatus.
Figure 2:
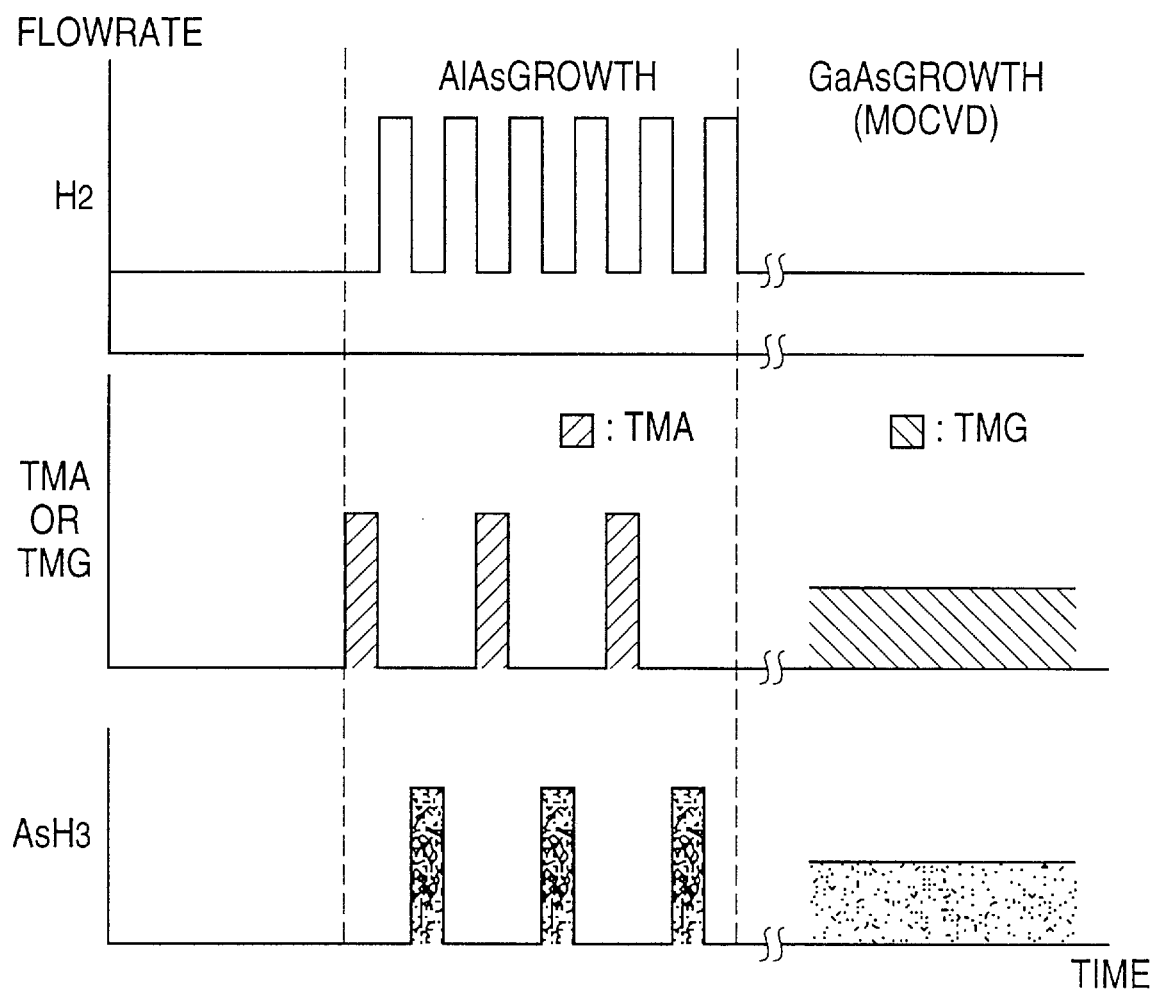
FIG. 2 is a diagram showing the switching of gases achieved in a conventional MOCVD apparatus.
Figure 3A:
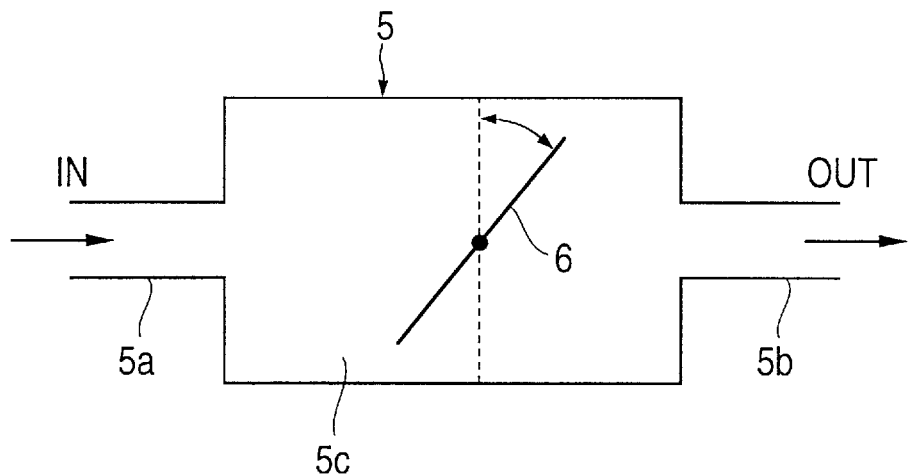
FIGS. 3(A) and 3(B) are diagrams showing the construction and conductance of a butterfly valve used in a conventional MOCVD apparatus.
Figure 3B:
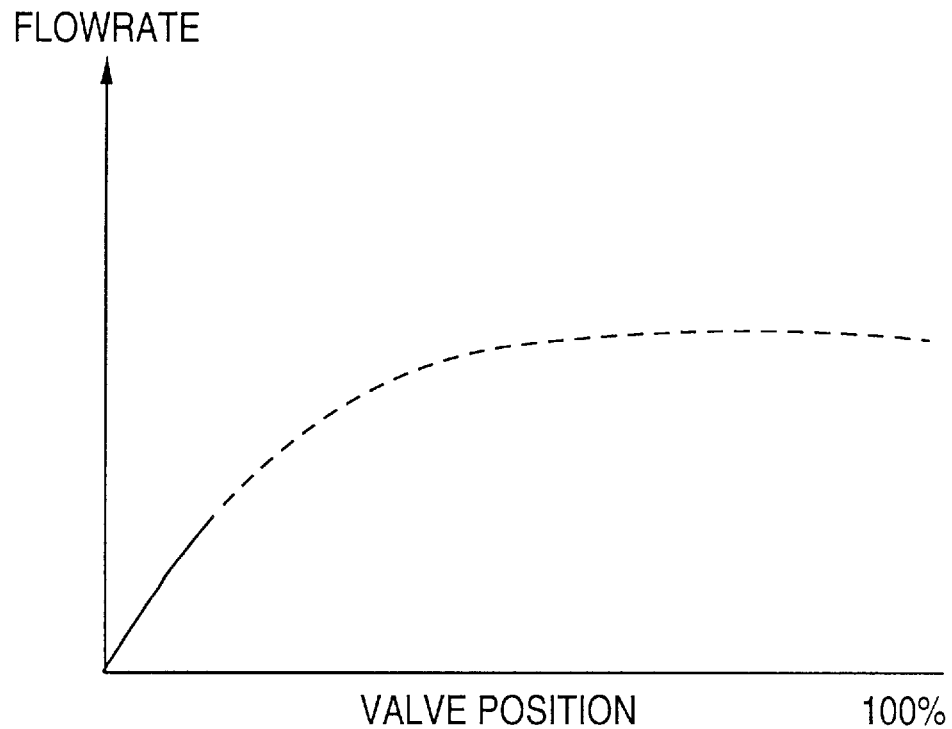
Figure 4A:
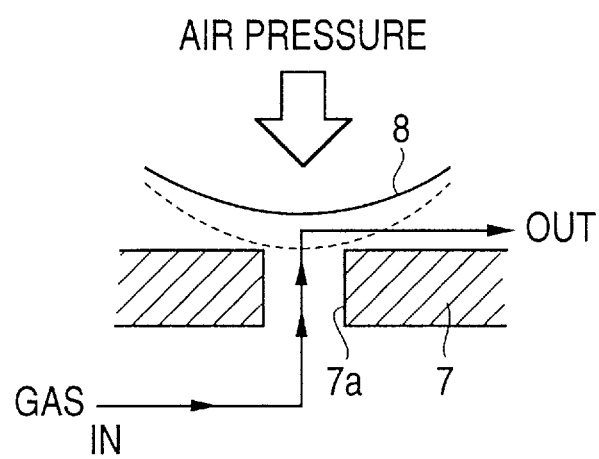
FIGS. 4(A) and 4(B) are diagrams showing the construction and conductance of an air-pressure activated valve used in a conventional MOCVD apparatus.
Figure 4B:
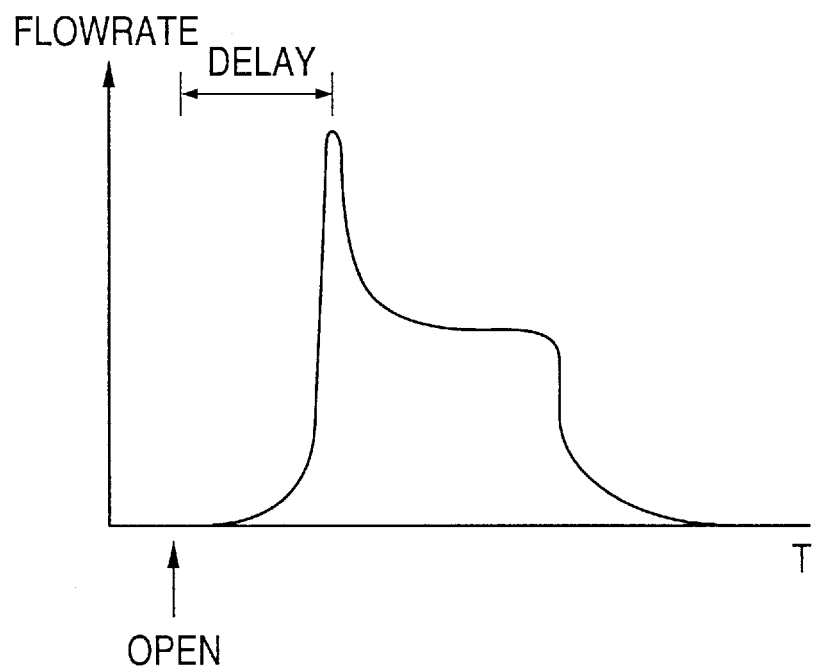
Figure 7:
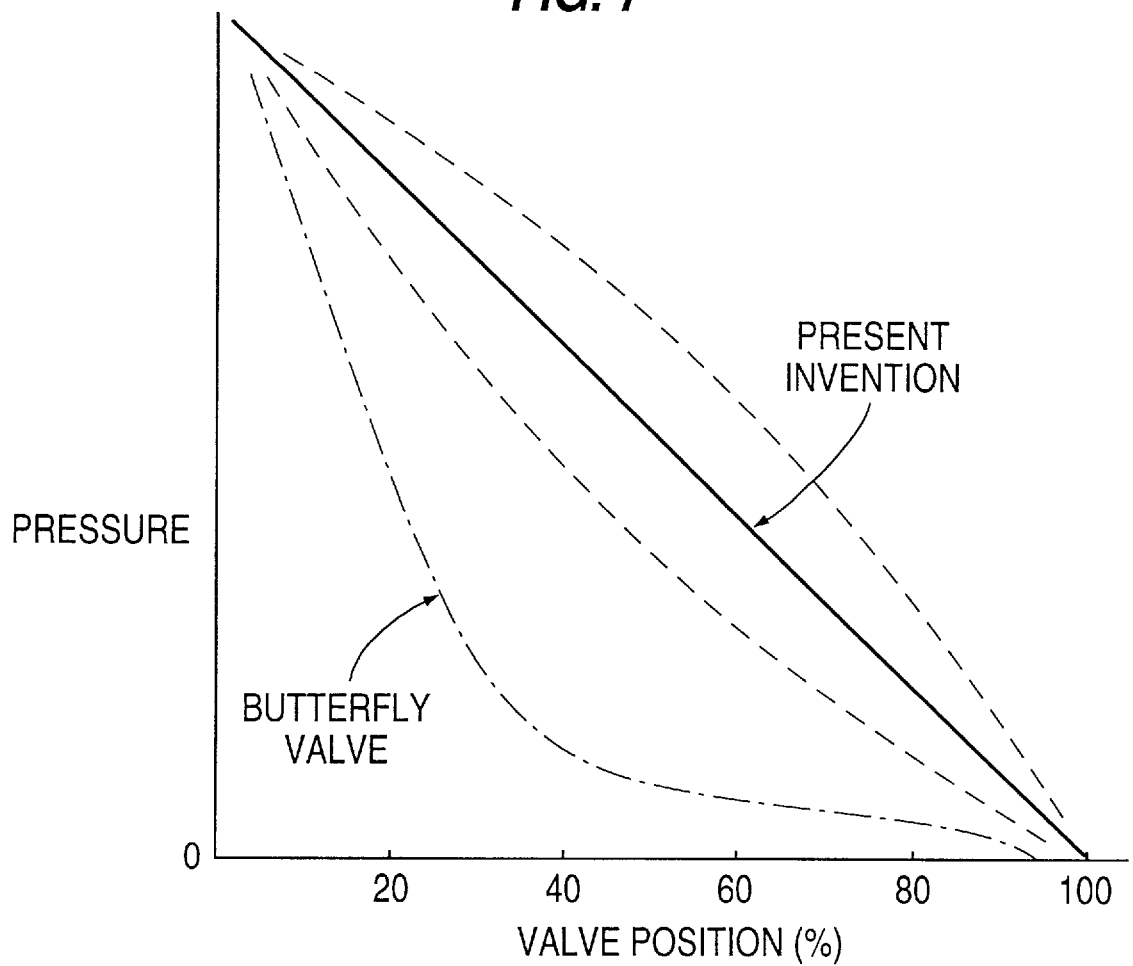
FIG. 7 is a diagram showing the relationship between the valve position and the pressure achieved by the flow control valve of FIG. 5 in comparison with a conventional butterfly valve.

FIG. 7 shows the relationship between the pressure inside the reaction chamber and the valve position for the case wherein the valve 10 of FIG. 5 is used in the CVD apparatus of FIG. 1 for evacuating the reaction chamber. In FIG. 7, the continuous line represents the relationship achieved by the valve 10 of FIG. 5. It will be noted that the pressure inside the reaction chamber decreases with increasing valve position. This indicates that one can control the flowrate linearly with the valve position for the range of the valve position between 0% and 100%. In the conventional butterfly valves, on the contrary, the flowrate changes linearly up to the valve position of about 40%. When the valve position increases more, it will be noted that the pressure inside the reaction chamber does not change substantially. Obviously, the result of FIG. 7 coincides with the relationship described with reference to FIG. 3(B).

As indicated in FIG. 7 by broken lines, it is possible to set the profile of the width W and the depth D of the groove 13a as a function of the angle θ such that the flowrate changes with the valve position according to any of the arbitrary functions.

Figure 8:
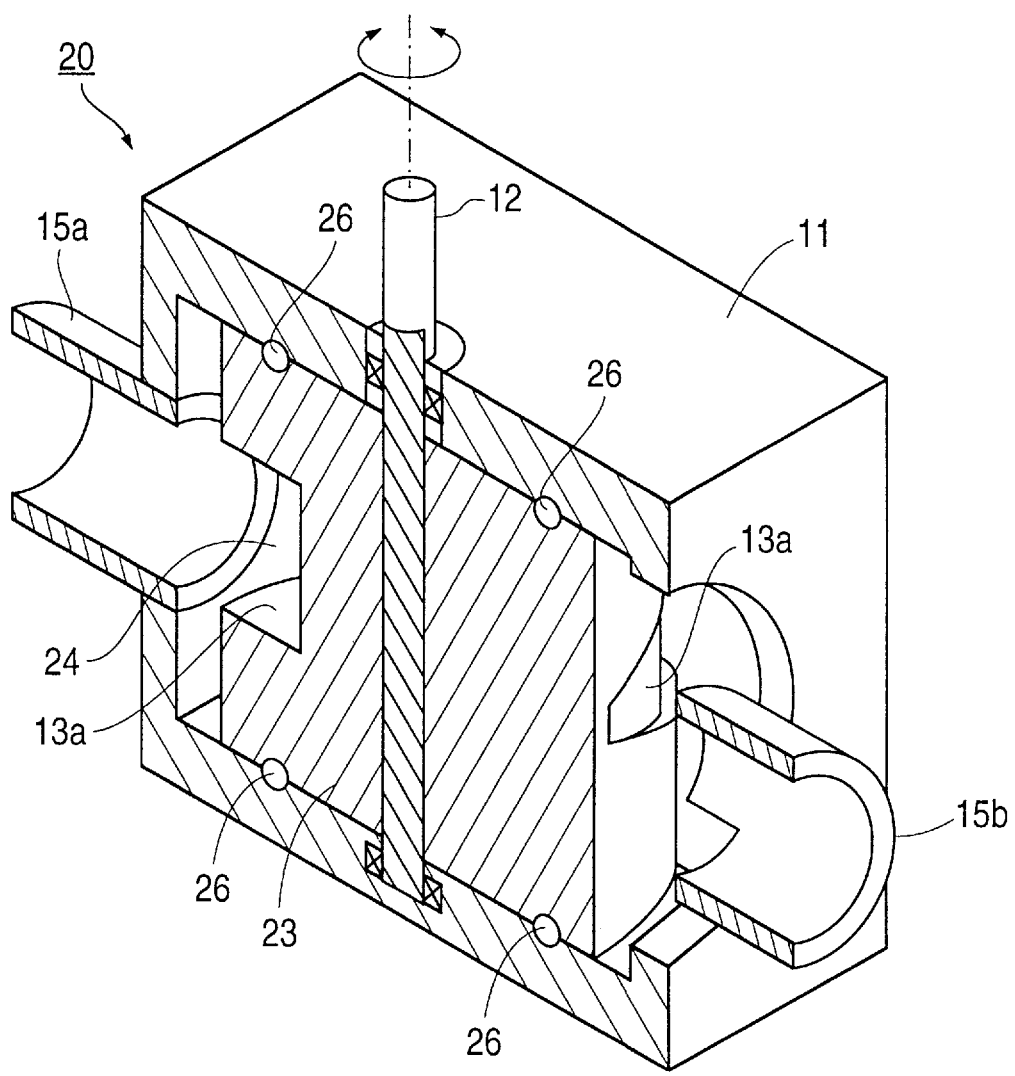
FIG. 8 is a diagram showing the construction of a flow control valve according to a second embodiment of the present invention.

FIG. 8 shows the construction of the flow control valve 20 according to a second embodiment of the present invention. In FIG. 8, those parts described previously with reference to preceding drawings are designated by the same reference numerals and the description thereof will be omitted.

In the embodiment of FIG. 8, a fluid passage 24 is provided in the valve box 11, wherein the fluid passage 24 is formed to have a rectangular cross section, contrary to the cylindrical fluid passage 14 of the first embodiment. Associated with this, a valve element 23 having a cylindrical form is used in place of the spherical valve element 13, wherein the valve element 23 is provided rotatable on the shaft 12 to as to rotate unitarily therewith. The cylindrical outer surface of the valve element 23 engages with the inner wall of the fluid passage 24, and the flow of the fluid from the inlet 15a to the outlet 15b through the fluid passage 24 is blocked by the valve element 23. It should be noted that both longitudinal end surfaces of the valve element 23 establish a sliding engagement with corresponding inner walls of the fluid passage 24 via a seal ring 26. The valve element 23 carries thereon a groove 13a, and the groove 13a form a passage of the fluid of which cross sectional area is changed similarly to the first embodiment. As other features of the present invention are substantially identical with the first embodiment, further description will be omitted.

Figure 9:
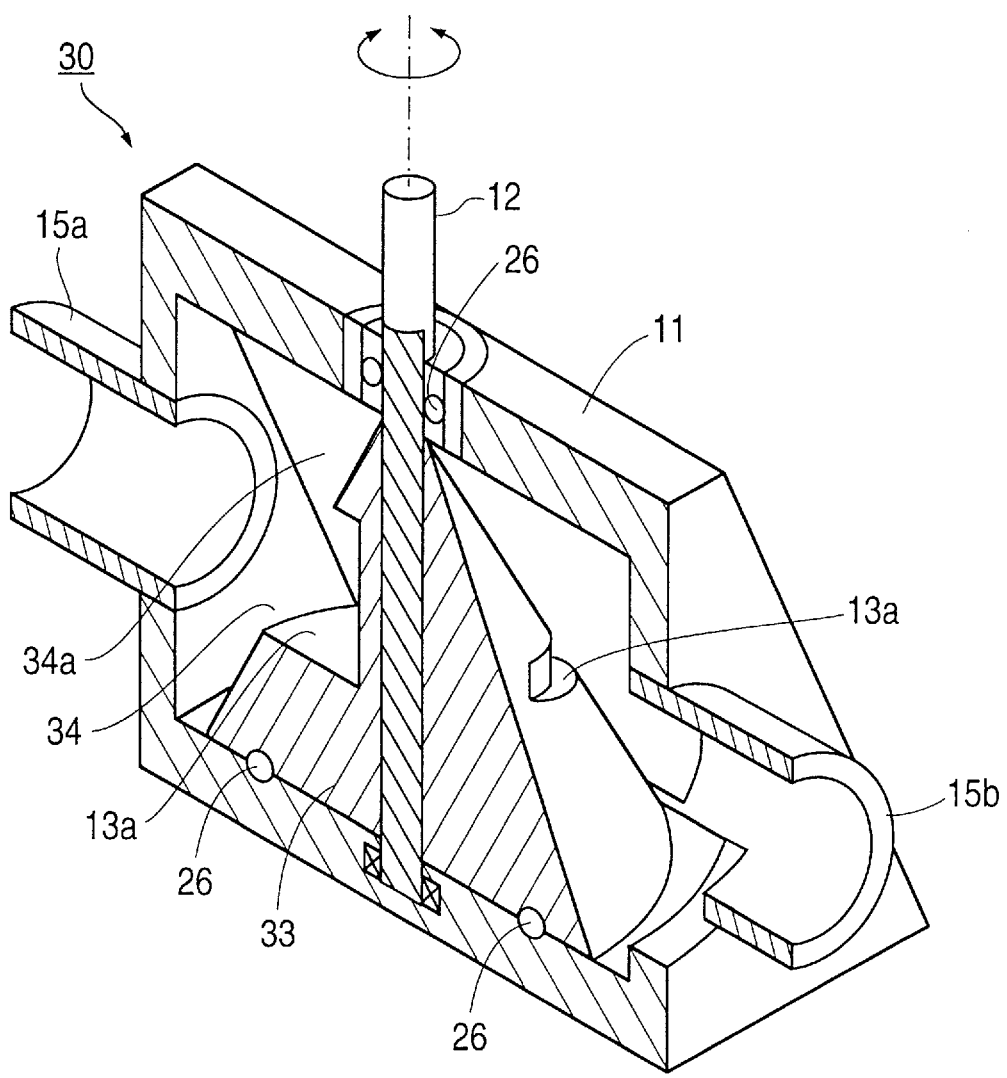
FIG. 9 is a diagram showing the construction of a flow control valve according to a third embodiment of the present invention.

FIG. 9 shows a construction of the flow control valve 30 according to a third embodiment of the present invention. In FIG. 9, those parts described previously are designated by the corresponding reference numerals and the description thereof will be omitted.

In the present embodiment, a fluid passage 34 having a triangular cross section is provided in the valve box 11, and a valve element 33 having a conical shape is provided in the fluid passage 34, in place of the valve element 13, such that the conical surface of the element 33 establishes an engagement with an inner wall 34a of the passage 34. The valve element 33 is held on the shaft 12 so as to be rotatable therewith, and the foregoing conical surface of the valve element 33 carries thereon a groove 13a that acts as a passage of the fluid. In this embodiment, too, the valve element 33 blocks the passage of the fluid from the inlet 15a to the outlet 15b as a result of the engagement with the passage 34, and the fluid flows through the foregoing groove 12a. By rotating the valve element 33 about the shaft 12, one can control the flowrate of the fluid flowing through the valve 30 accurately as a function of the rotational angle of the valve 33.

Figure 10A:
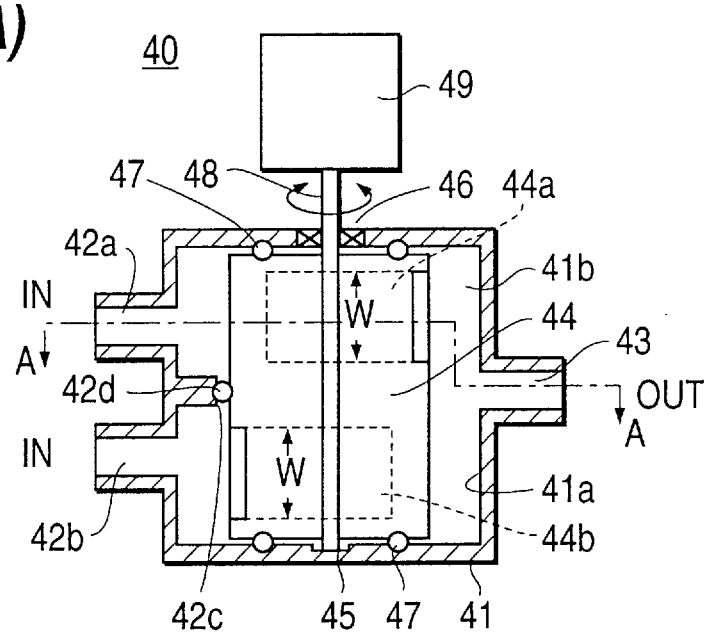
FIGS. 10(A) and 10(B) are diagrams showing the construction of a fluid switching valve according to a fourth embodiment of the present invention.
Figure 10B:
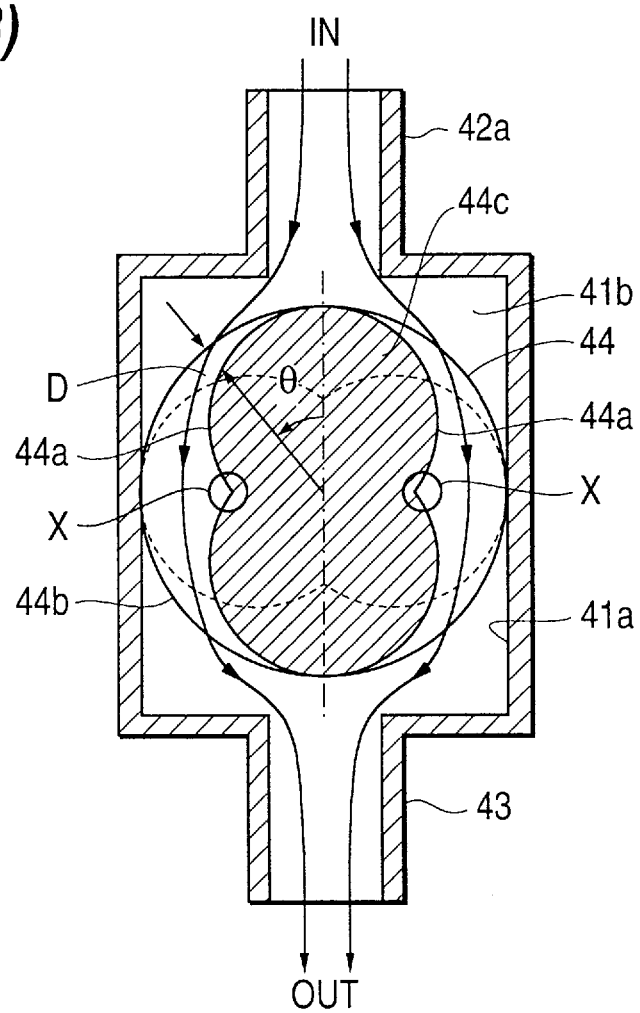

Next, a fluid switching valve 40 according to a fourth embodiment of the present invention will be described with reference to FIGS. 10(A) and 10(B), wherein FIG. 10(A) shows an elevational cross section of the valve 40 while FIG. 10(B) shows a horizontal cross section of the same valve 40.

Referring to FIG. 10(A), the fluid switching valve 40 includes a rectangular valve box 41, wherein the valve box 41 is formed with a rectangular space 41b that is defined by an inner wall 41a. Further, the valve box 41 has a first inlet 42a and a second inlet 42b on a first side thereof such that the first and second inlets 42a and 42b communicate with the space 41b. Further, on a second side opposite to the first side of the valve box 41, there is provided an outlet 43 in communication with the space 41b for discharging the fluid from the valve 40. The space 41b has a rectangular cross section when viewed in a direction connecting the first side and the second side, and a cylindrical valve element 44 is provided in said space 41b vertically. Thereby, a rotational shaft 48 is provided coincident to the axis of cylinder such that the shaft 48 extends vertically, and the cylindrical valve element 44 is rotated together with the shaft 48 with respect to the valve box 41. The valve element 44 thereby engages with the inner wall 41a of the space 41b and prevents the fluid from flowing from the foregoing first inlet 42a or second inlet 42b to the outlet 43. In other words, the valve element 44 establishes a hermetic seal with respect to the space 41b. As can be seen in the elevational cross sectional view of FIG. 10(A), the rotational shaft 48 is held on the valve box 41 by bearings 45 and 46 in a rotatable manner, and the top as well as the bottom end surfaces of the valve element 44 establishes a sliding engagement with the corresponding inner wall of the valve box 41 via a seal ring 47. The rotational shaft 48 is driven by a motor 49. On the other hand, the side wall of the cylindrical valve element 44 engages with the inner wall of the space 41b in the valve box 41 as indicated in the horizontal cross sectional view of FIG. 10(B).

Further, as indicated in the cross sectional diagram of FIG. 10(A), the first inlet 42a and the second inlet 42b are arranged to align vertically with each other at the foregoing first side of the valve box 41, wherein there is provided a compartment wall 42c between the foregoing first inlet 42a and the second inlet 42b so that the compartment wall 42c engages with the side all of the valve body 44 at the first side of the valve box 41. The compartment wall 42c is formed with a semicircular cutout so as to engage with the side wall of the valve element 44, wherein the semicircular cutout carries a seal ring 42d for engagement with the valve element 44. Thereby, the seal ring 42d isolates the first inlet 42a and the second inlet 42b from each other.

On the side wall of the valve element 44, there are provided a pair of grooves 44a and 44b in correspondence to the foregoing first inlet 42a and the second inlet 42b, respectively. As shown in the elevational cross sectional view of FIG. 10(A), the groove 44b is provided at an axially upper position of the valve element 44 in correspondence to the inlet 42b, while the groove 44a is provided at an axially lower position of the valve element 44 in correspondence to the inlet 42a. Each of the grooves 42a and 42b has a constant width W.

On the other hand, as indicated in FIG. 10(B), each of the grooves 44a and 44b are formed to have a depth D such that the depth D increases, when measured in a cylindrical coordinate system that is set on the valve element 44 in agreement to the cylindrical axis of the valve element 44, with an argument θ. The depth D becomes maximum at the argument θ of 90 degrees. Further, the origin of the argument θ is set to be different by 90 degrees in the groove 44a and in the groove 44b. In other words, the grooves 44a and 44b are formed with a mutual offset of 90 degrees. In addition, each of the grooves 44a and 44b is formed symmetrical with each other horizontally as well as vertically and has a shape similar to the numeral "8" characterized by an inflection point X. Thus, the groove 44a includes an upper part and a lower part formed symmetrical with each other, while the groove 44b includes a right part and a left part formed symmetrical with each other. In the state of FIG. 10(B), the groove 44a communicates the first side wherein the inlet 42a is provided and the second side wherein the outlet 43 is provided, and the fluid introduced into the inlet 42a flows to the outlet 53 through the groove 44a as indicated in an arrow. In FIG. 10(B), the part designated by a hatching and bears the reference numeral 44c indicates the cross section of the valve element 44 itself. Thus, the fluid flows while circumventing the part 44c. On the other hand, the groove 44b does not communicate between the first and second sides in the state of FIG. 10(B), and the fluid introduced into the second inlet 42b is blocked by the valve body 44.

Hereinafter, the operation of the fluid switching valve 40 will be described with reference to FIGS. 11(A)–11(D). In the drawings, the illustration at the right indicates the state of the groove 44a, while the illustration at the left indicates the state of the groove 44b.

Figures 11C, 11D:
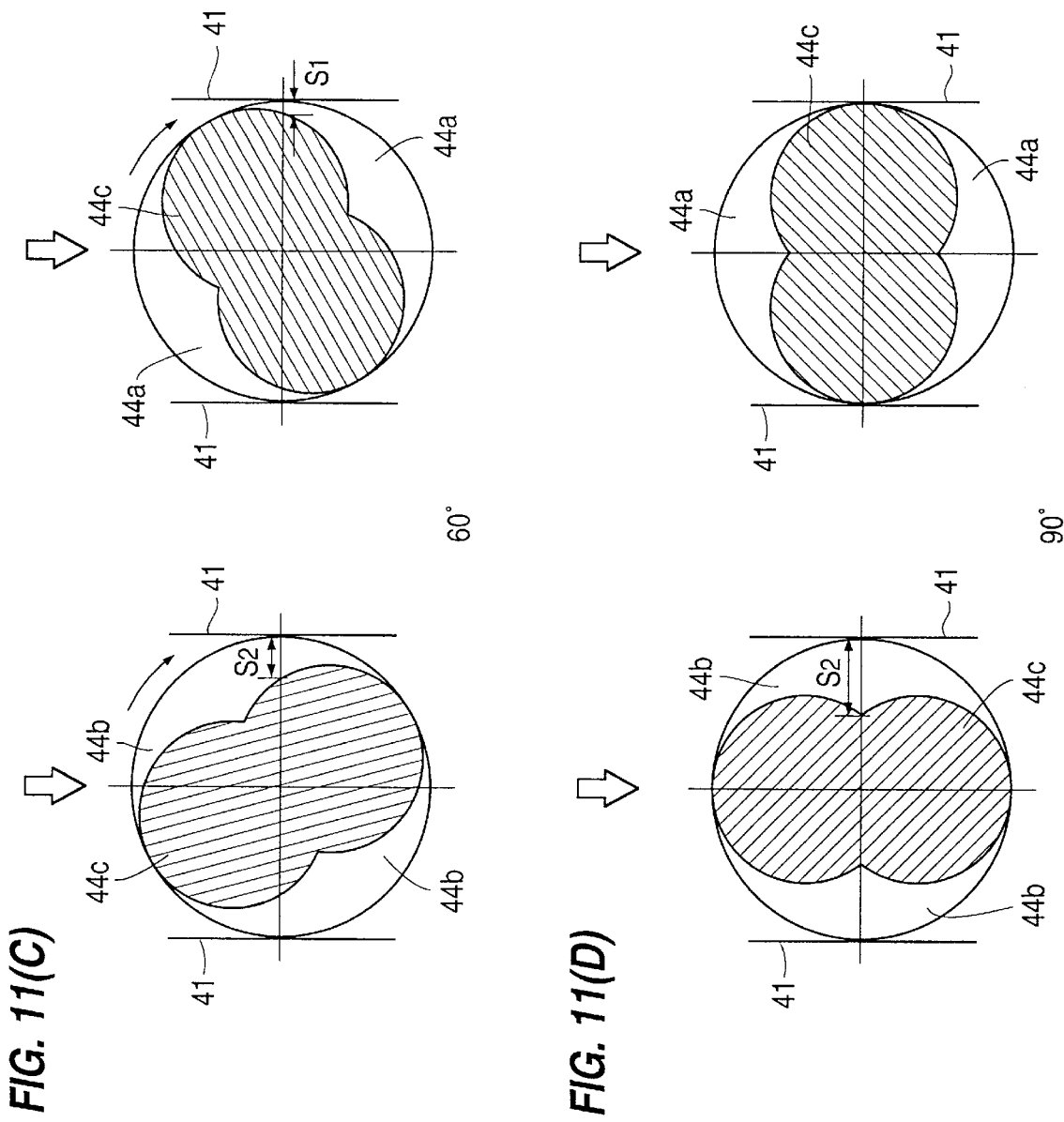

FIG. 11(A) shows the state corresponding to FIG. 10(B) and provides a maximum flowrate for the first fluid that flows through the groove 44a, in correspondence to the maximum cross section $S_1$ of the groove 44a. On the other hand, the second fluid flowing through the groove 44b is blocked by the valve element 44 in correspondence to the cross sectional area $S_2$ of the groove 44b that is set zero in this state. With a rotational motion of the valve element 44 in the clockwise direction from the state of FIG. 11(A) to the state of FIG. 11(B), the cross sectional area $S_2$ of the groove 44a decreases while the cross sectional area $S_2$ of the groove 44b increases. In correspondence to this, the flowrate of the first fluid flowing through the groove 44a decreases, while the flowrate of the second fluid flowing through the groove 44b increases. With further rotation of the valve element 44 in the clockwise direction to the state of FIG. 11(C), the cross sectional area $S_1$ of the groove 44a decreases further, while the cross sectional area $S_2$ of the groove 44b increases further. As a result, the flowrate of the first fluid flowing through the groove 44a decreases further while the flowrate of the second fluid flowing through the groove 44b increases further. In the state of FIG. 11(D) wherein the valve element 44 assumes an angle of 90 degrees as compared with the valve element 44 in the state of FIG. 11(A), the cross sectional area $S_1$ of the groove 44a becomes zero, and the flow of the first fluid is completely blocked by the valve element 44. On the other hand, the cross sectional area $S_2$ of the groove 44b becomes maximum in this state, and the flowrate of the second fluid through the groove 44b becomes maximum.

The fluid switching valve 40 of the present embodiment mixes the first fluid introduced to the inlet 42a and the second fluid introduced to the inlet 42b with a controlled mixing ratio and discharges the mixed fluid thus formed from the outlet 43. Thereby, one can switch the composition of the mixed fluid from the first fluid to the second fluid or from the second fluid to the first fluid, by rotating the valve element 44 by 90 degrees. By using the fluid switching valve 40 of the present invention, it is possible to control the mixing ratio accurately even in the transient state of switching the composition of the fluid, and one can successfully avoid the problem of formation of unwanted interface layer in the MOCVD apparatus of FIG. 1 by using the fluid switching valve 40 for the valves 2a–2h.

Particularly, by setting the depth D of the grooves 44a and 44b as a function of the argument θ such that the cross sectional area $S_1$ and the cross sectional area $S_2$ satisfy a relationship $S_1(\theta)+S_2(\theta)$=constant, it is possible to control the flowrate of the fluid discharged from the outlet 43 substantially constant not only before and after the switching of the fluid but also during the transient interval for switching the fluid, and an accurate control of composition is achieved for the semiconductor layer grown by the MOCVD process.

Figure 12:
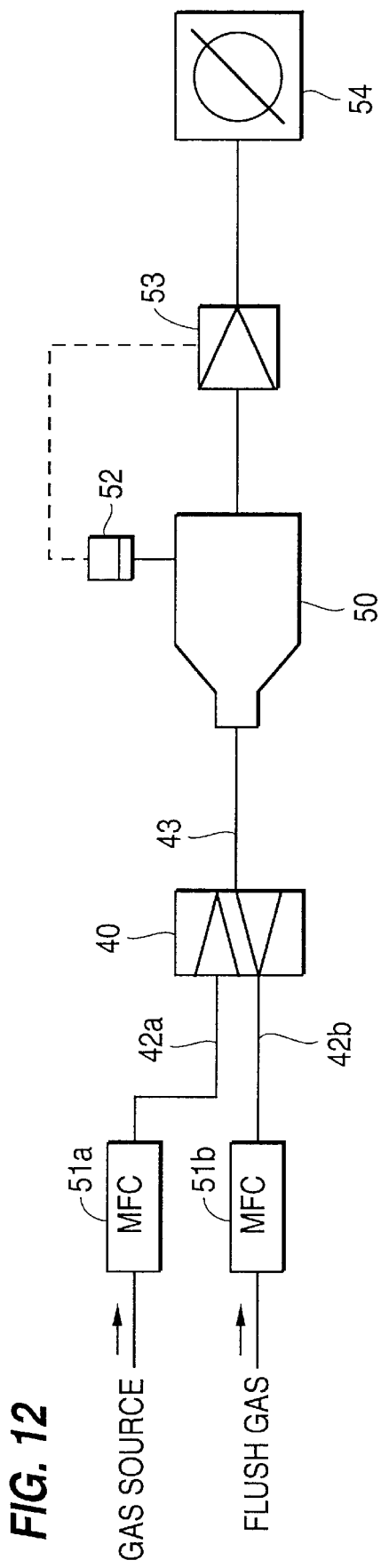
FIG. 12 is a diagram showing the construction of a MOCVD apparatus that uses a fluid switching valve and a flow control valve of the present invention.

FIG. 12 shows the construction of an MOCVD apparatus that uses the fluid switching valve 40 of the present embodiment for switching the gas that is introduced into the reaction chamber between a gaseous source material and an inert gas.

Referring to FIG. 12, the MOCVD apparatus includes a reaction chamber 50 that is evacuated by a pump 54, and the reaction chamber 50 is supplied selectively with a gaseous source material and an inert gas through respective mass flow controllers 51a and 51b as well as through the fluid switching valve 40 of the present invention. In the illustrated example, the gaseous source material is supplied to the inlet 42a of the fluid switching valve 40 while the inert gas is supplied to the inlet 42b. The gaseous material thus introduced into the fluid switching valve 40 is supplied from the outlet 43 to the reaction chamber 50. As already noted, the reaction chamber 50 is evacuated by the pump 54, and a flowrate control vale 53 having a construction described with reference to FIG. 5 is provided between the reaction chamber 50 and the pump 54 for controlling the pressure in the reaction chamber 50. Further, the reaction chamber 50 is provided with a vacuum gauge for measuring the pressure inside the reaction chamber 50, and the flow control valve 53 is controlled in response to the output of the vacuum gauge 52 such that the pressure inside the reaction chamber 50 is maintained substantially constant. In such a construction of the MOCVD apparatus, it is possible to eliminate the pressure fluctuation inside the reaction chamber associated with the switching of the gaseous materials.

Figure 13:
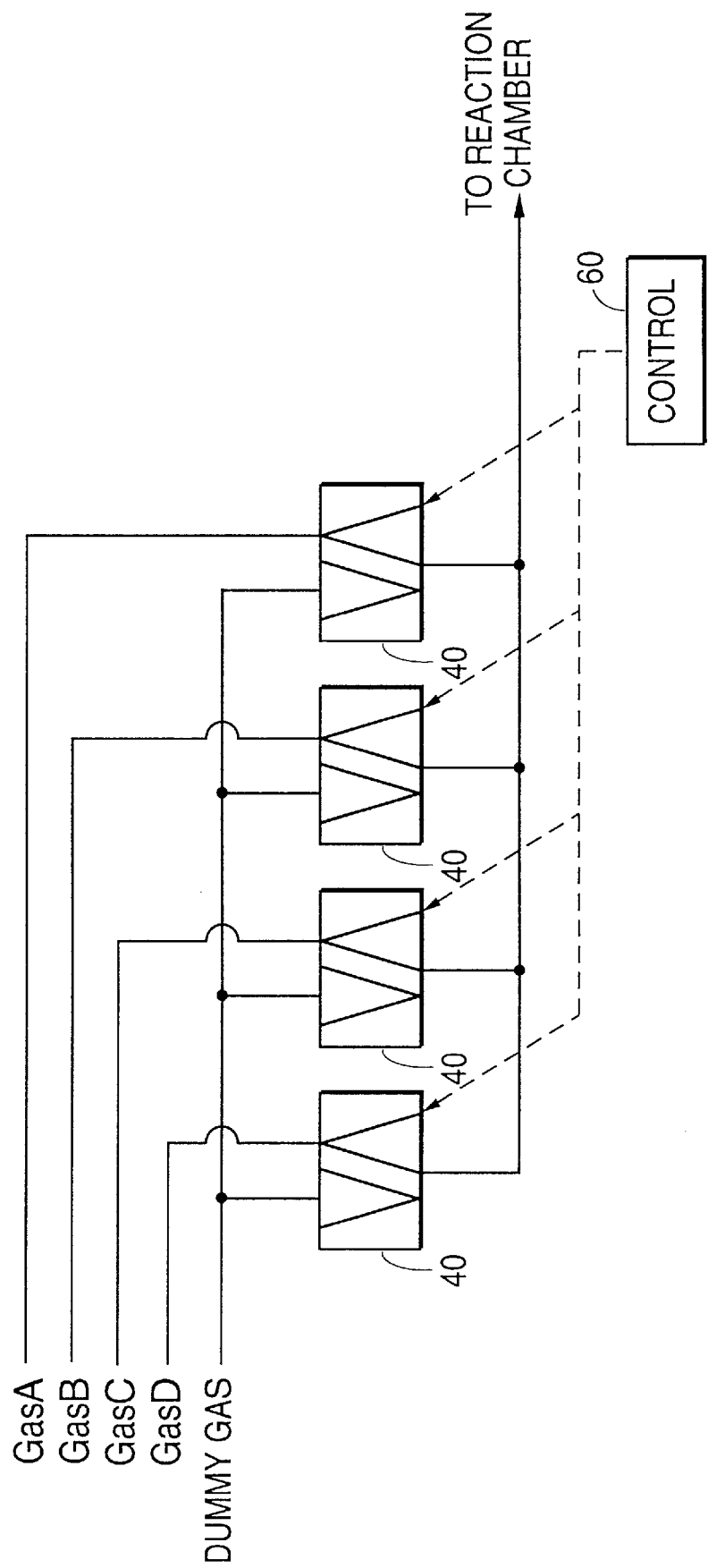
FIG. 13 is a diagram showing the construction of a MOCVD apparatus that uses a fluid switching valve of the present invention.

One may use the fluid switching valve 40 in large numbers for switching a large number of gases such that a selected gas alone is supplied to the reaction chamber. FIG. 13 shows such a construction, wherein the MOCVD apparatus includes a plurality of fluid switching valves 40 for selecting the gas that is supplied to the reaction chamber from gases A–D as well as an inert gas. Thereby, it is advantageous to control the valves 40 by a single controlling unit 60. For example, one may connect the rotational shaft 12 commonly between the fluid switching valves and drive the shaft 12 by a single motor 49.

The fluid switching valve 40 of the present invention is particularly suitable for the switching valves 2a–2h of the MOCVD apparatus explained with reference to FIG. 1 for eliminating the pressure fluctuation associated with the switching of the gases.

In the construction of FIG. 10(B), it should be noted that it is not necessary to provide the grooves 44a and 44b symmetrical with respect to the part 44c but these grooves may be provided at only one side of the part 44c. Further, the grooves 44a and 44b may be formed to have a shape similar to the groove 13a described with reference to the embodiment of FIG. 1 such that the grooves 44a and 44b extend for an arc length of 90 degrees or other suitable arc length, in place of the arc length of 180 degrees.

Further, the present invention is not limited to the embodiments described heretofore, but various variations and modifications may be made without departing from the scope of the invention.

What is claimed is:

1. A method for growing a semiconductor layer on a substrate held in a reaction vessel, by supplying a gaseous source material selected from a plurality of gaseous source materials into said reaction vessel, comprising a step of:

switching said plurality of gaseous source materials by activating a fluid switching valve to select said gaseous source material that is supplied to said reaction vessel, said fluid switching valve including:

a valve box having a plurality of inlets for introducing said plurality of gaseous source materials, a single outlet for discharging a gaseous source material, and a single passage of gaseous source material defined by an inner wall and provided in said valve box so as to communicate between said plurality of inlets and said single outlet;

a valve element provided in said passage of said valve box so as to be rotatable about a rotational axis, said valve element having an outer surface in conformance with said inner wall of said passage of gaseous source material for inhibiting said gaseous source material from passing from said inlet to said outlet through said passage: and a compartment wall provided in engagement with said valve element for inhibiting a gaseous source material introduced into any one of said plurality of inlets to flow to the other inlets;

said outer surface of said valve element being formed to inhibit a passage of said fluid from said inlet to said outlet for an arbitrary rotational angle of said valve element about said rotational axis, said valve element carrying, on said outer surface thereof, a plurality of grooves provided in correspondence to said plurality of inlets such that each of said grooves extend along said outer surface of said valve element for an arc length when viewed in a direction of said rotational axis, each of said plurality of grooves guiding a gaseous source material introduced to a corresponding inlet to said single outlet;

each of said plurality of grooves having a depth and a width such that at least one of said depth and said width changes from a first end of said groove to a second opposite end of said groove, each of said plurality of grooves being formed to have a shape such that said fluid switching valve provides a substantially constant conductance of gaseous source material:

said step of switching being conducted while maintaining a conductance of said fluid switching valve substantially constant;

said step of switching including a step of rotating said valve element.

2. A method for growing a semiconductor layer on a substrate held in a reaction chamber, by supplying a gaseous source material selected from a plurality of gaseous source materials into said reaction chamber, said method comprising:

introducing said plurality of source materials through a plurality of inlets into a fluid switching valve;

passing said plurality of source materials through a passage in which a valve element is disposed;

adjusting said valve element so as to allow said gaseous source materials to be mixed and flow through the passage, wherein a flow rate of said gaseous materials being defined by the following equation:

$$S1(\theta)+S2(\theta)=\text{constant}$$

where $S1(\theta)$ and $S2(\theta)$ represent cross sectional areas of grooves formed in said valve element, said adjusting including adjusting said cross sectional areas by rotating said valve element to allow a predetermined volume of a first gas and a predetermined volume of a second gas to mix, thereby achieving said gaseous source material; and supplying said gaseous source material to said reaction chamber through an outlet in said fluid switching valve.

* * * * *